United States Patent [19]
Risley

[11] 3,805,177
[45] Apr. 16, 1974

[54] AMPLIFIER CIRCUIT HAVING VARIABLE AUTOMATIC GAIN CONTROL

[75] Inventor: Curtis A. Risley, Snyder, N.Y.

[73] Assignee: GTE Sylvania Incorporated, Stamford, Conn.

[22] Filed: Nov. 24, 1972

[21] Appl. No.: 309,350

[52] U.S. Cl. .............. 330/29, 179/1 VL, 330/30 D, 330/86
[51] Int. Cl. .............. H03g 3/30
[58] Field of Search .............. 179/1 P, 1 VC, 1 VL; 330/29, 30 D, 69, 86, 144

[56] References Cited

UNITED STATES PATENTS

| | | | |
|---|---|---|---|
| 3,210,680 | 10/1965 | Farris | 330/29 X |
| 3,226,653 | 12/1965 | Miller | 330/29 X |

OTHER PUBLICATIONS

Hughes, "A Balanced Input Microphone Preamplifier" - Electronics - (Australia), pp. 72–79, July 1970.

*Primary Examiner*—Herman Karl Saalbach
*Assistant Examiner*—Lawrence J. Dahl
*Attorney, Agent, or Firm*—David M. Keay; Elmer J. Nealon; Norman J. O'Malley

[57] ABSTRACT

Balanced differential amplifier having two transistors. A feedback network including a first resistance, a diode-bridge variable attenuator (vario-losser) and a second resistance are connected in series between the collectors of the transistors. Feedback is taken from the juncture of the first resistance and the diode-bridge variable attenuator to the base of one transistor and from the juncture of the second resistance and the diode-bridge variable attenuator to the base of the other transistor. The resistance of the diode-bridge variable attenuator is inversely related to the DC current passing through it. Thus, the proportion of the differential output between the collectors fed back to the bases can be controlled by controlling the DC current providing variable automatic gain control of the amplifier.

7 Claims, 4 Drawing Figures

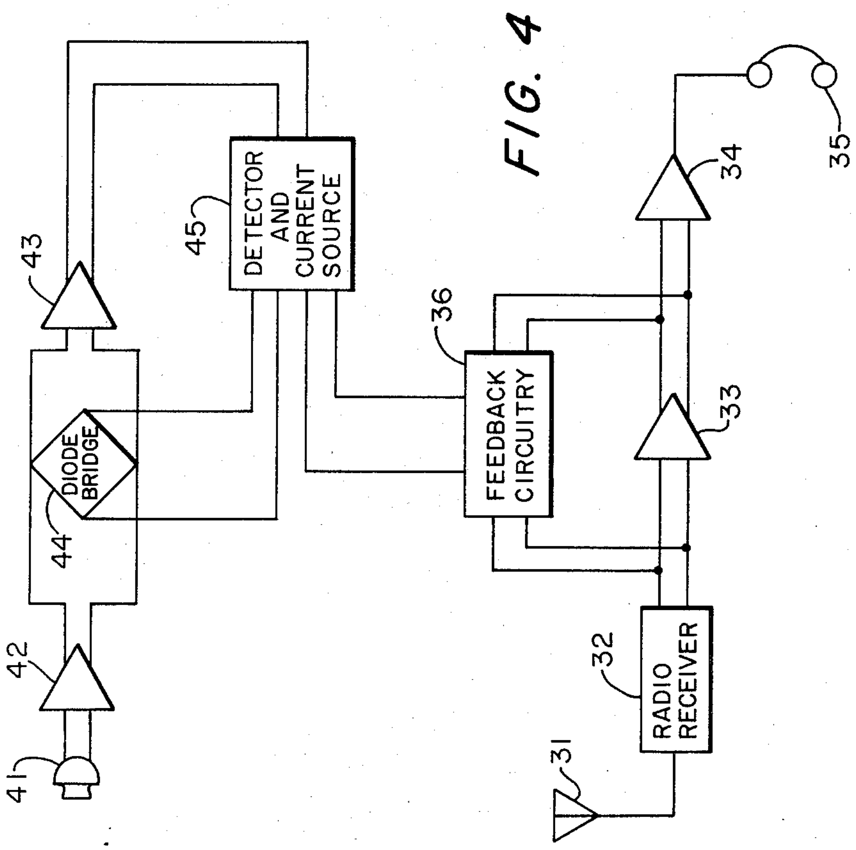
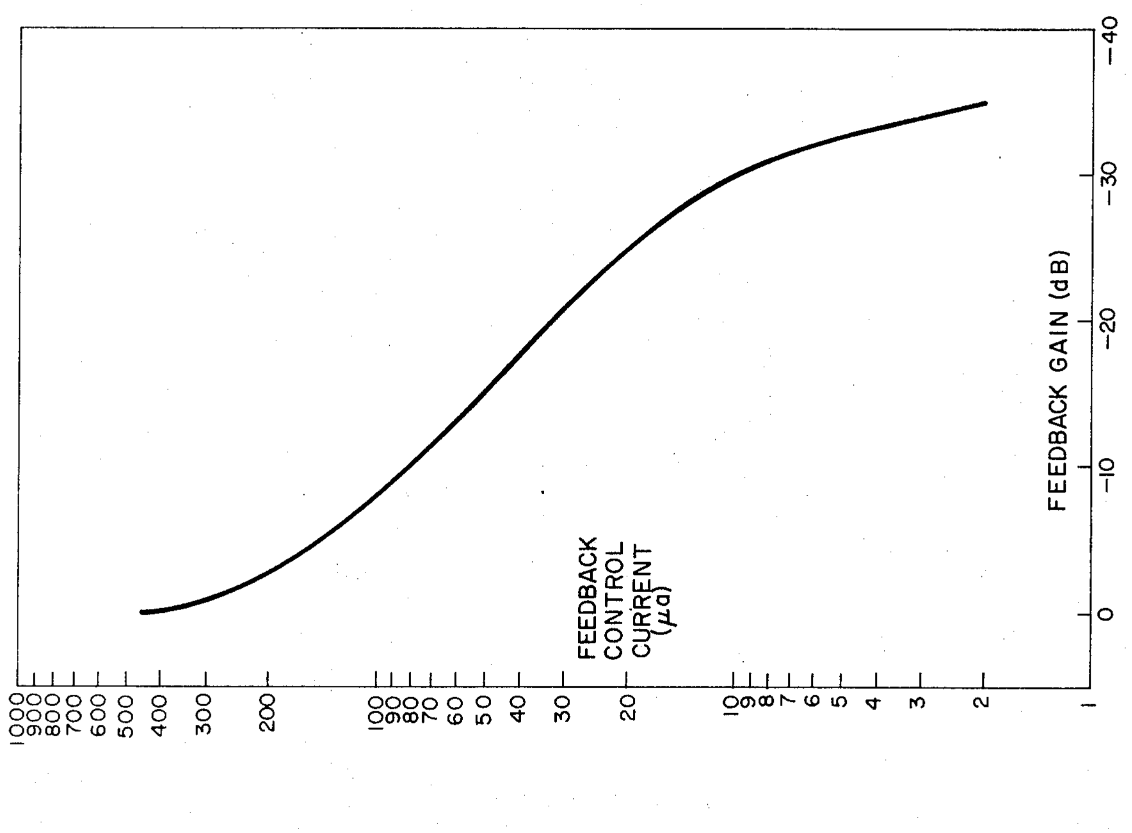
FIG. 4
FIG. 3

AMPLIFIER CIRCUIT HAVING VARIABLE AUTOMATIC GAIN CONTROL

BACKGROUND OF THE INVENTION

This invention relates to amplifier circuits. More particularly, it is concerned with differential amplifier circuits having automatic gain control (AGC).

It is common practice to provide amplifiers with automatic gain control circuitry in order to maintain the amplitude of the output signal relatively constant over a wide range of variation in the amplitude of the incoming signal. One manner of accomplishing this result is to produce a direct current voltage of appropriate polarity which is proportional to the average value of the output signal and apply it to the input to the amplifier to control the gain of the amplifier inversely with respect to signal strength. That is, a large input signal produces a large AGC signal, the polarity of which is such that when applied to bias the input electrode of an amplifying stage, the current through the amplifying stage is reduced, thus decreasing the gain of the amplifying stage and reducing the amplitude of the output signal. Although the foregoing technique of "reverse biasing" to provide automatic gain control is satisfactory for many applications, there are situations in which it may be desirable to vary the degree of control provided by the automatic gain control circuitry.

SUMMARY OF THE INVENTION

A differential amplifier circuit in accordance with the present invention which has variable automatic gain control includes a differential amplifier having a pair of amplifying devices. There are input connections to the amplifying devices for applying a differential input signal thereto and output connections from the amplifying devices for obtaining a differential output signal therefrom. Feedback means are connected between the two output connections from the amplifying devices. A first feedback connection means is connected to the input connection of one of the amplifying devices and to the feedback means, and a second feedback connection means is connected to the input connection of the other of the amplifying devices and to the feedback means. The feedback means includes a variable impedance means which is connected between the first and second feedback connection means. A control means is provided for varying the value of the impedance of the variable impedance means. By varying the impedance value of the variable impedance means the proportion of the differential output signal which is fed back to the amplifying devices by way of the input connections is varied, thus varying the gain of the differential amplifier.

BRIEF DESCRIPTION OF THE DRAWINGS

Additional objects, features, and advantages of differential amplifier circuits in accordance with the present invention will be apparent from the following detailed discussion together with the accompanying drawings wherein:

FIG. 3 is a graph of the transfer characteristic of the feedback circuitry of a specific circuit in accordance with the embodiment of the invention illustrated in FIG. 2; and FIG. 4 is a block diagram of apparatus employing circuitry in accordance with the present invention to control the gain of an audio amplifier in response to the background noise level.

DETAILED DESCRIPTION OF THE INVENTION

Figure 1:
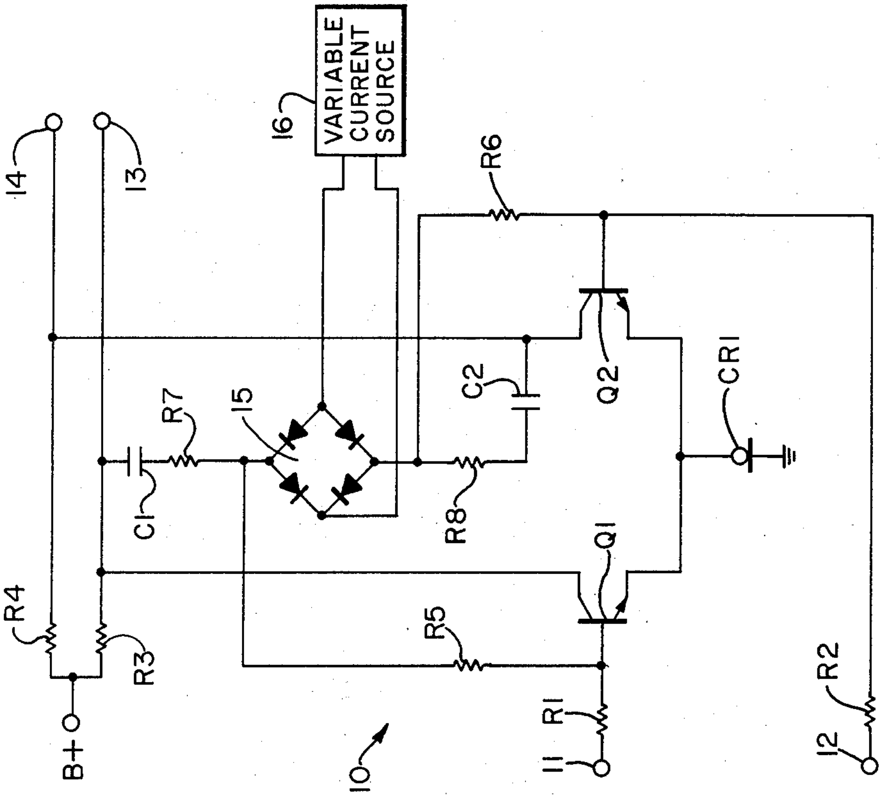
FIG. 1 is a schematic circuit diagram of a differential amplifier circuit in accordance with the present invention.

One embodiment of a differential amplifier 10 in accordance with the invention is illustrated in FIG. 1. The amplifier is a balanced differential amplifier circuit employing a pair of NPN transistors Q1 and Q2. A differential input signal is applied to the bases of the transistors Q1 and Q2 by way of input terminals 11 and 12 through input resistances R1 and R2, respectively. The emitters of the transistors are connected directly to each other and through a constant current diode CR1 to ground. The collectors of the transistors Q1 and Q2 are connected to a B+ voltage source of operating potential through resistances R3 and R4, respectively. The differential output signal from the amplifier is taken between output terminals 13 and 14 which are connected directly to the collectors of transistors Q1 and Q2, respectively.

Feedback circuitry in accordance with the invention includes a DC blocking capacitor C1, a first resistance R7, a diode-bridge variable attenuator 15, a second resistance R8, and a DC blocking capacitor C2 connected in series between the collector of the first transistor Q1 and the collector of the second transistor Q2. The diode-bridge variable attenuator 15 is a known network of four silicon diodes arranged as shown in FIG. 1. It is sometimes known as a "vario-losser." The diodes are of a type having the characteristic that their resistance decreases with increasing DC current flow. Thus, the value of resistance provided by the diode-bridge variable attenuator 15 between resistances R7 and R8 varies inversely with the DC current supplied by a variable current source 16.

Feedback is taken from the juncture of the first resistance R7 and the diode-bridge variable attenuator 15 and applied through a first feedback resistance R5 to the base of the first transistor Q1. Feedback is also taken from the juncture of the second resistance R8 and the diode-bridge variable attenuator 15 through a second feedback resistance R6 to the base of the second transistor Q2. This arrangement produces negative feedback to the transistors.

The differential amplifier of FIG. 1 operates in the usual well-known manner to produce a differential output signal between the output terminals 13 and 14 in response to a differential input signal applied across the input terminals 11 and 12. The proportion of the output signal fed back to the bases of the transistors depends upon the resistance provided by the diode-bridge variable attenuator 15 which is inversely related to the DC current from the current source 16. When the value of resistance is low, the feedback differential is low and thus the gain of the amplifier is relatively high. When the resistance value of the diode-bridge variable attenuator 15 is relatively large by virtue of a small DC control current from the variable current source 16, the proportion of the output signal fed back to the transistors Q1 and Q2 is also relatively large. The gain of the amplifier is, therefore, relatively low. Thus, the gain of the amplifier circuit is controlled by varying the proportion of the output signal fed back for automatic gain control and the proportion is regulated by the variable current source 16.

Figure 2:
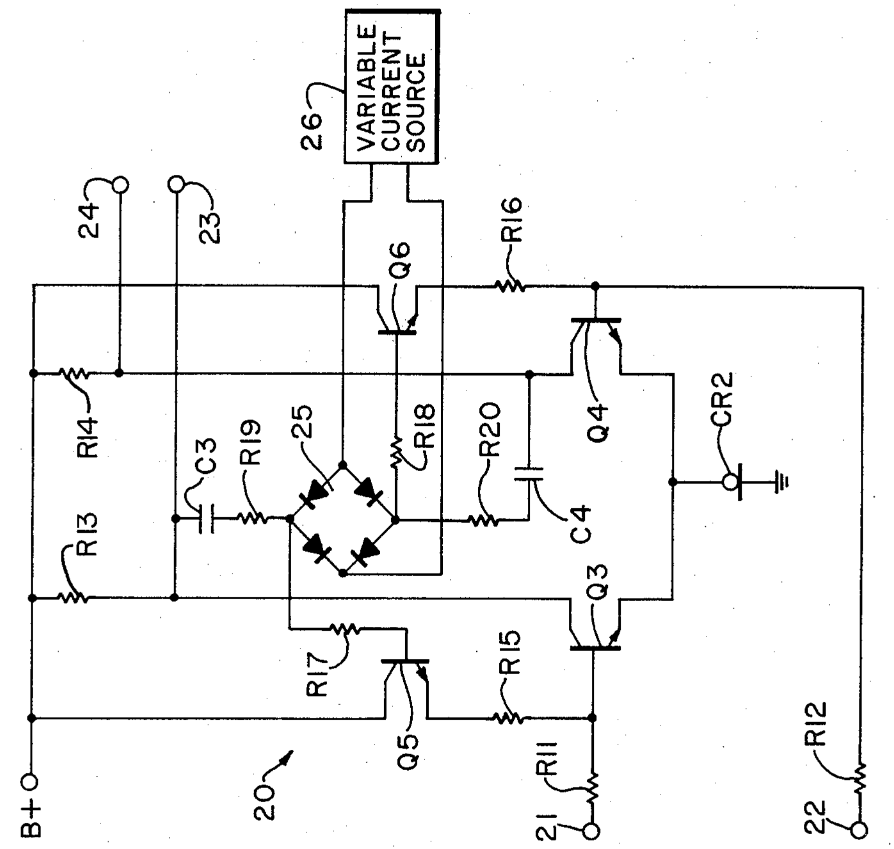
FIG. 2 is a schematic circuit diagram of another embodiment of a differential amplifier circuit in accordance with the present invention.

Another embodiment of a differential amplifier 20 in accordance with the present invention is illustrated in FIG. 2. This amplifier is similar to that of FIG. 1 including a first NPN transistor Q3 and a second NPN transistor Q4 connected as a balanced differential amplifier. The bases of the transistors are connected to input terminals 21 and 22 through input resistances R11 and R12, respectively. Their emitters are connected directly to each other and through a constant current diode CR2, which maintains the total current flow through the two transistors constant, to ground. The collectors of the transistors are connected through resistances R13 and R14, respectively, to a B+ source of operating voltage and directly to output terminals 23 and 24.

A feedback network including a DC blocking capacitor C3, a first resistance R19, a diode-bridge variable attenuator 25, a second resistance R20, and a DC blocking capacitor C4 are connected between the collector of the first transistor Q3 and the collector of the second transistor Q4. A variable current source 26 is connected to the diode-bridge variable attenuator 25 to provide a variable DC current for controlling the value of the resistance of the diode-bridge variable attenuator 25.

The amplifier circuit 20 of FIG. 2 differs from that shown in FIG. 1 by including emitter-follower transistors in the feedback paths from the feedback network to the bases of the amplifying transistors. A first NPN feedback transistor Q5 has its base connected through a resistance R17 to the juncture of the first resistance R19 and the diode-bridge variable attenuator 25. Its emitter is connected through a resistance R15 to the base of the first amplifying transistor Q3 and its collector is connected directly to the B+ voltage source. A second NPN feedback transistor Q6 has its base connected through a resistance R18 to the juncture of the second resistance R20 and the diode-bridge variable attenuator 25. Its emitter is connected through a resistance R16 to the base of the second amplifying transistor Q4 and its collector is connected directly to the B+ voltage source.

The amplifier circuit 20 of FIG. 2 operates in the same manner as the circuit 10 of FIG. 1. The feedback transistors Q5 and Q6 cause the feedback in the circuit 20 of FIG. 2 to be unilateral. That is, feed-forward around the amplifying transistors by way of the feedback paths is prevented. As a result, the amplifier circuit 20 of FIG. 2 operates over a wider dynamic range than the amplifier circuit 10 of FIG. 1.

As an example, a specific embodiment of the amplifier circuit 20 of FIG. 2 may employ the following components:

| | |
|---|---|
| Q3 | 2N930 |
| Q4 | 2N930 |
| Q5 | 2N930 |
| Q6 | 2N930 |
| Diodes of the diode-bridge attenuator **25** | 1N4148 |
| CR2 | 250 microampere constant current diode |
| All resistors | 10 kilohms |
| B+ | 12 volts |

FIG. 3 is a graph of the transfer characteristic of the automatic gain control circuitry of the foregoing specific embodiment. The effect of variations in DC current from the variable current source 26 on the gain of the amplifier circuit is illustrated by the curve.

FIG. 4 is a block diagram illustrating a particular application of a differential amplifier circuit in accordance with the invention with the automatic gain control circuitry operated in an open loop gain control scheme where precise gain control is desired and the output of the controlled amplifier does not control the gain of the amplifier. The apparatus as illustrated in FIG. 4 includes radio receiving equipment including an antenna 31 connected to a radio receiver 32. The audio output of the receiver 32 is applied to a differential amplifier 33 employing feedback circuitry 36 in accordance with the foregoing description. The output of the differential amplifier 33 is applied to another audio amplifier 34 which is connected to a suitable transducer 35.

The apparatus also includes a microphone 41 for picking up background noise in the area of the transducer 35. The microphone 41 is connected to an amplifier 42 which in turn is connected to a differential amplifier 43. A diode-bridge variable attenuator, or variolosser, 44 is connected across the inputs to the differential amplifier 43. The differential output signal from the amplifier 43 is detected and employed to control the DC current from a current source in a detector and current source 45.

The use of a diode-bridge variable attenuator for controlling the gain of a differential amplifier circuit by connecting in shunt across the input connections of the amplifier is well-known. As the DC current through the diode-bridge variable attenuator is increased, its resistance decreases shunting input current therethrough and reducing the differential input signal to the amplifier. The combination of the diode-bridge variable attenuator 44, the differential amplifier 43, and the detector and current source 45 as illustrated in FIG. 4 is a typical well-known automatic gain control arrangement. In addition, in the apparatus illustrated in FIG. 4, DC current from the detector and current source 45 is also applied to the diode-bridge variable attenuator in the feedback circuitry 36 associated with the amplifier 33 in the radio receiving equipment.

The apparatus of FIG. 4 operates in the following manner. When the background noise in the area of the transducer 35 of the radio receiving equipment increases and is picked up by the microphone 41, the amplitude of the signal applied to the differential amplifier 43 by way of the differential amplifier 42 increases. The change in output of the differential amplifier 43 causes increased DC current to be supplied to the diode-bridge variable attenuator 44 by the detector and current source 45. The resistance of the diode-bridge variable attenuator 44 is reduced shunting more of the output signal from the amplifier 42, and thus providing automatic gain control for the differential amplifier 43. DC current from the detector and current source 45 is also applied to the feedback circuitry 36 causing the resistance of the diode-bridge variable attenuator in the feedback circuitry to be reduced, thereby decreasing the proportion of the output signal from the amplifier 33 which is fed back to the input. Since the feedback is negative, the gain of the amplifier 33 is increased. Thus, the apparatus of FIG. 4 operates to increase the gain of the amplifier 33 when the background noise increases and to decrease the gain of the amplifier 33 when the background noise decreases.

While there has been shown and described what are considered preferred embodiments of the present invention, it will be obvious to those skilled in the art that various changes and modifications may be made therein without departing from the invention as defined in the appended claims.

What is claimed is:

1. A differential amplifier circuit with variable automatic gain control including in combination a differential amplifier having a pair of amplifying devices;

input connections to said amplifying devices for applying a differential input signal thereto;

output connections from said amplifying devices for obtaining a differential output signal therefrom;

feedback means connected between the output connections from the amplifying devices;

first feedback connection means connected to the input connection to one of said amplifying devices and to said feedback means;

second feedback connection means connected to the input connection to the other of said amplifying devices and to said feedback means;

said feedback means including a variable impedance means connected between the first and second feedback connection means; said variable impedance means including a diode-bridge variable attenuator, the value of the impedance of the diode-bridge variable attenuator being inversely related to the DC current passing therethrough; and control means including a variable source of DC current for varying the value of the impedance of said variable impedance means whereby the proportion of the differential output signal fed back to the input connections to control the gain of the differential amplifier is varied.

2. A differential amplifier circuit in accordance with claim 1 wherein said feedback means includes a first impedance connected between the output connection from the one of said amplifying devices and said diode-bridge variable attenuator, and a second impedance connected between the output connection from the other of said amplifying devices and said diode-bridge variable attenuator, whereby said feedback means includes said first impedance, said diode-bridge variable attenuator, and said second impedance connected in series between the output connection from the one of said amplifying devices and the output connection from the other of said amplifying devices;

said first feedback connection means is connected to said feedback means at the juncture of said first impedance and said diode-bridge variable attenuator; and said second feedback connection means is connected to said feedback means at the juncture of said second impedance and said diode-bridge variable attenuator.

3. A differential amplifier circuit in accordance with claim 2 wherein each of said amplifying devices is a semiconductive amplifying device having an input electrode, an output electrode, and a common electrode;

said input connections are connected to the input electrodes of the respective semiconductive amplifying devices;

said output connections are connected to the output electrodes of the respective semiconductive amplifying devices;

said common electrodes are connected together; and said differential amplifier includes means connected to said common electrodes and operable to maintain the sum of the currents through the pair of semiconductive amplifying devices constant.

4. A differential amplifier circuit in accordance with claim 3 wherein said semiconductive amplifying devices are bipolar transistors of the same conductivity type, the bases being the input electrodes, the collectors being the output electrodes, and the emitters being the common electrodes.

5. A differential amplifier circuit in accordance with claim 4 wherein said first feedback connection means includes a first feedback impedance connected between the base of the one transistor and the juncture of said first impedance and the diode-bridge variable attenuator; and said second feedback connection means includes a second feedback impedance connected between the base of the other transistor and the juncture of said second impedance and the diode-bridge variable attenuator.

6. A differential amplifier circuit in accordance with claim 4 wherein said differential amplifier includes a source of operating potential;

the collectors of the bipolar transistors are connected to said source of operating potential;

said first feedback connection means includes a first feedback bipolar transistor having its base connected to the juncture of said first impedance and the diode-bridge variable attenuator, its emitter connected to the base of the one transistor, and its collector connected to said source of operating potential; and said second feedback connection means includes a second feedback bipolar transistor having its base connected to the juncture of said second impedance and the diode-bridge variable attenuator, its emitter connected to the base of the other transistor, and its collector connected to said source of operating potential.

7. Apparatus including in combination a differential amplifier circuit in accordance with claim 3;

a second differential amplifier having a second pair of semiconductive amplifying devices;

second input connections to said second pair of amplifying devices for applying a differential input signal thereto;

second output connections from said second pair of amplifying devices for obtaining a differential output signal therefrom;

a second diode-bridge variable attenuator connected across said second input connections, the value of the impedance of the second diode-bridge variable attenuator being inversely related to the DC current passing therethrough;

said control means being connected to said second diode-bridge variable attenuator and being operable to supply DC current to said first-mentioned diode-bridge variable attenuator and to said second diode-bridge variable attenuator, the amount of current supplied to the diode-bridge variable attenuators being related to the level of an input voltage applied to the control means; and detector means connected to said second output connections and to said control means and operable to apply an input voltage to said control means proportional to the differential output signal at said second output connections;

whereby an increase in the differential input signal to the second differential amplifier causes the impedance of the second diode-bridge variable attenuator across the second input connections to decrease and the proportion of the differential output signal from the first-mentioned output connections from the first-mentioned amplifying devices which is fed back to the input connections to the first-mentioned amplifying devices to be decreased, and a decrease in the differential input signal to the second differential amplifier causes the impedance of the second diode-bridge variable attenuator across the second input connections to increase and the proportion of the differential output signal from the first-mentioned output connections from the first-mentioned amplifying devices which is fed back to the input connections to the first-mentioned amplifying devices to be increased.

* * * * *